US006780759B2

(12) United States Patent
Farrens et al.

(10) Patent No.: US 6,780,759 B2
(45) Date of Patent: Aug. 24, 2004

(54) METHOD FOR MULTI-FREQUENCY BONDING

(75) Inventors: Shari N. Farrens, Davis, CA (US);
Mark A. Franklin, Plano, TX (US);
William J. Franklin, Felton, CA (US);
Wei Liu, San Jose, CA (US)

(73) Assignee: Silicon Genesis Corporation, San Jose, CA (US)

( * ) Notice: Subject to any disclaimer, the term of this patent is extended or adjusted under 35 U.S.C. 154(b) by 0 days.

(21) Appl. No.: 09/969,550

(22) Filed: Oct. 1, 2001

(65) Prior Publication Data

US 2003/0003684 A1 Jan. 2, 2003

Related U.S. Application Data

(60) Provisional application No. 60/289,913, filed on May 9, 2001.

(51) Int. Cl.[7] .............................. H10L 23/58
(52) U.S. Cl. .................. 438/635; 438/655; 438/656; 438/657
(58) Field of Search .................. 438/455, 456, 438/457, 653

(56) References Cited

U.S. PATENT DOCUMENTS

| | | | |
|---|---|---|---|
| 5,421,953 A | 6/1995 | Nagakubo et al. | |
| 6,180,496 B1 | 1/2001 | Farrens et al. | |
| 6,194,290 B1 | 2/2001 | Kub et al. | |
| 6,291,343 B1 * | 9/2001 | Tseng et al. | 438/653 |
| 6,423,613 B1 | 7/2002 | Geusic | |
| 6,645,828 B1 | 11/2003 | Farrens et al. | |
| 2002/0092618 A1 * | 7/2002 | Collins | 156/345.48 |

FOREIGN PATENT DOCUMENTS

| | | |
|---|---|---|
| JP | 03270209 A | 12/1991 |
| WO | WO 96/13060 A1 | 5/1996 |
| WO | WO 99/10927 A1 | 3/1999 |

OTHER PUBLICATIONS

Kissinger, G., and Kissinger, W. (1993) "Void–free silicon–wafer–bond strengthening in the 200–400 C range," Sensors and Actuators, vol. A36, No. 2, pp. 149–156.

Roberds, B.E. (1997). "Science and Technology of Plasma Activated Direct Wafer Bonding," PhD Dissertation, University of California at Davis, School of Engineering, pp. 1–120.

Watt, V.H.C. and Bower, R.W., (1994). "Low Temperature Bonding Direct of Non–Hydrophillic Surfaces," Electronics Letters, pp. 693–695.

Zucker, O. et al. (1993). "Application of oxygen plasma processing to silicon direct bonding," Sensors and Actuators, vol. A36, No. 3, pp. 227–231.

Roberds, B.E. (1998). "Science and Technology of Plasma Activated Direct Wafer Bonding," PhD Dissertation, University of California at Davis, School of Engineering, pp. 1–120.

* cited by examiner

Primary Examiner—Dung A. Le
(74) Attorney, Agent, or Firm—Townsend and Townsend and Crew LLP (57) ABSTRACT

A method and technique for achieving a high strength bond between two substrates includes igniting a plasma using a source RF signal. The substrates are biased with a bias RF signal during surface treatment by the plasma. The treated surfaces are brought into contact. The resulting bonded substrates show an improvement over bonds attained using conventional bonding techniques.

30 Claims, 7 Drawing Sheets

METHOD FOR MULTI-FREQUENCY BONDING

CROSS REFERENCE TO RELATED APPLICATION

This application claims priority from the following application: U.S. Provisional Application Ser. No. 60/289,913, filed May 9, 2001, in the name of Shari N. Farrens et al. entitled, "Method, Apparatus for Multi-Frequency Bonding," which is commonly owned and hereby incorporated by reference for all purposes.

BACKGROUND OF THE INVENTION

This invention relates generally to substrate bonding techniques. More particularly, the invention relates to techniques for providing high strength and high quality bonding techniques for fabricating multilayered substrates. Such substrates include semiconductors, silicon-on-insulator substrates, compound semiconductors, ceramic packaging materials, and metallic and nonmetallic films. The substrates can be used for the manufacture of semiconductor devices, MEMS, photonic devices, waveguides, ink head and other dispensing devices, polymeric coated or polymeric devices, and laminated devices, as well as biomedical applications.

Conventional wafer bonding includes "direct" wafer bonding of silicon wafers, which attach themselves to each other by placing faces of such wafers directly together. Direct bonding has often been considered as an alternative to using organic or inorganic bonding agents for bonding silicon and a number of other semiconductor materials. For example, direct bonding can be facilitated by first activating the surface of the wafer with a $NH_4OH$ based solution for silicon and its oxides. For nitrides such as AlN and $Si_3N_4$ an acid bath or an HF dip might be used. Plasma exposure has been another technique for activating the surfaces of wafers to be bonded. A pioneering technique that has been developed for such plasma exposure is described in U.S. Pat. No. 6,180,496, entitled "In Situ Plasma Wafer Bonding Method," in the name of Farrens, et al., commonly assigned, and hereby incorporated by reference for all purposes. Such surface activation methods render the wafer surfaces hydrophilic and amenable to bonding. After surface activation, the wafers can be placed in a spinner where they may be rinsed in de-ionized water or other chemical agent. The wafers are then placed surface to surface, at which point van der Waals forces pull the two wafers into contact.

The contact bonds, which are formed in accordance with conventional wet surface activation, are generally weak, and not suitable for device processing. This is because the process of oxidation (or corrosion of any kind), which is the underlying mechanism of all high temperature direct bonding of semiconductor materials, is the result of a two step process: (1) migration of the reacting species to the reaction site and (2) the subsequent chemical reaction itself. The energy that must be supplied to the "system" to cause the silicon and the oxygen atoms to migrate and react is quite large, and as such this particular reaction is not self-sustaining at low temperatures. Therefore, the bonds have been typically strengthened by high temperature anneals for silicon and its oxides, and moderate temperature anneals for nitrides.

Other limitations also exist using conventional bonding techniques. For example, plasma activation bonding of substrates can cause plasma damage to surfaces of the substrates before bonding. Such damage can lead to lower bond quality as well as resulting damage to devices fabricated on such bonded substrates. Some of the damage caused by plasma activation can be repaired, at least in part, by heat treatment of the bonded substrates. Heat treatment, however, is not generally desirable for the manufacture of substrates using conventional layer transfer techniques using hydrogen species. Such hydrogen species often diffuse out of the substrate during high temperature thermal treatment, which leads to difficulty in transferring such layer using one of a variety of separation techniques. These and other limitations of conventional bonding techniques have been described throughout the present specification and more particularly below.

From the above, it is seen that an improved technique for bonding substrates together is highly desirable.

SUMMARY OF THE INVENTION

According to the present invention, techniques for bonding substrates together are provided. More particularly, the invention provides a method and apparatus for using multiple frequencies in a plasma environment for activating surfaces of substrates before bonding them together. Although the invention has been applied to the manufacture of semiconductor wafers, it would be recognized that the invention has a much broader range of applicability such as the manufacture of semiconductor devices, MEMS, photonic devices, ink head and other dispensing devices, polymeric coated or polymeric devices, waveguides and other photonic applications, and laminated devices, as well as biomedical applications.

In a specific embodiment, the invention provides a method for bonding surfaces of different substrates together. The method includes providing a first substrate having a first surface to be bonded. The method also includes supplying a gas; and igniting the gas to produce plasma using a first frequency signal (e.g., RF frequency) from an electromagnetic source. The method also includes producing a second signal and applying the second frequency signal (e.g., RF frequency) to the plasma to maintain the plasma on the first substrate. The first surface of the first substrate is exposed to the plasma being driven by the second frequency without substantial etching of the first surface. In some embodiments, this process may be repeated for the first surface of the second substrate although this is not needed for all applications. The method then contacts the first surface of the first substrate to a first surface of a second substrate to produce a bond there between.

In an alternative embodiment, the invention includes an apparatus for bonding substrates together. The apparatus has a work chamber for receiving therein one or more substrates. The apparatus also has a first electrically conductive platen disposed in the work chamber; and a second electrically conductive platen disposed in the work chamber and spaced apart from the first platen by a distance d. A first signal feedthrough is coupled to the first platen for receiving a first frequency signal (e.g., RF). A second frequency signal (e.g., RF) feedthrough is coupled to the second platen for receiving a second frequency signal having a frequency less than a frequency of the first frequency signal. The work chamber has a gas inlet for receiving a gas. The gas is ignited to form a plasma by the first frequency signal. A surface of a substrate is disposed in electrical contact with the second platen is exposed to the plasma. The first signal is also such that the plasma will not substantially etch the surface, since it is maintained away from the surface. In some embodiments, two or more wafers are in the chamber and such wafers are biased to the second platen at the second frequency, where they are simultaneously activated. After such activation, they can be joined together in the chamber or removed to a separate chamber for joining, which bond the wafers together.

Numerous benefits are achieved by way of the present invention. For example, the invention can be used with conventional process technology. Additionally, the invention can be used to effectively bond wafers together without substantially damaging them using plasma tools. Here, the damage is the type that causes undesirable yield and/or quality problems (e.g., unacceptable). In other embodiments, the invention can produce a high quality bond at lower temperatures, which is effective for certain layer transfer operations, such as a controlled cleaving processes or a thermal separation process. Depending upon the embodiment, there can be one or more of these benefits. These and other benefits are described in more detail throughout the present specification and more particularly below.

The teachings of the present invention can be readily understood by considering the following detailed description in conjunction with the accompanying drawings:

DESCRIPTION OF THE SPECIFIC EMBODIMENTS

According to the present invention, techniques for bonding substrates together are provided. More particularly, the invention provides a method and apparatus for using multiple frequencies in a plasma environment for activating surfaces of substrates before bonding them together. Although the invention has been applied to the manufacture of semiconductor wafers, it would be recognized that the invention has a much broader range of applicability such as the manufacture of semiconductor devices, MEMS, ink head and other dispensing devices, polymeric coated or polymeric devices, photonic devices, waveguides and other photonic applications, and laminated devices, as well as biomedical applications.

Figure 1:
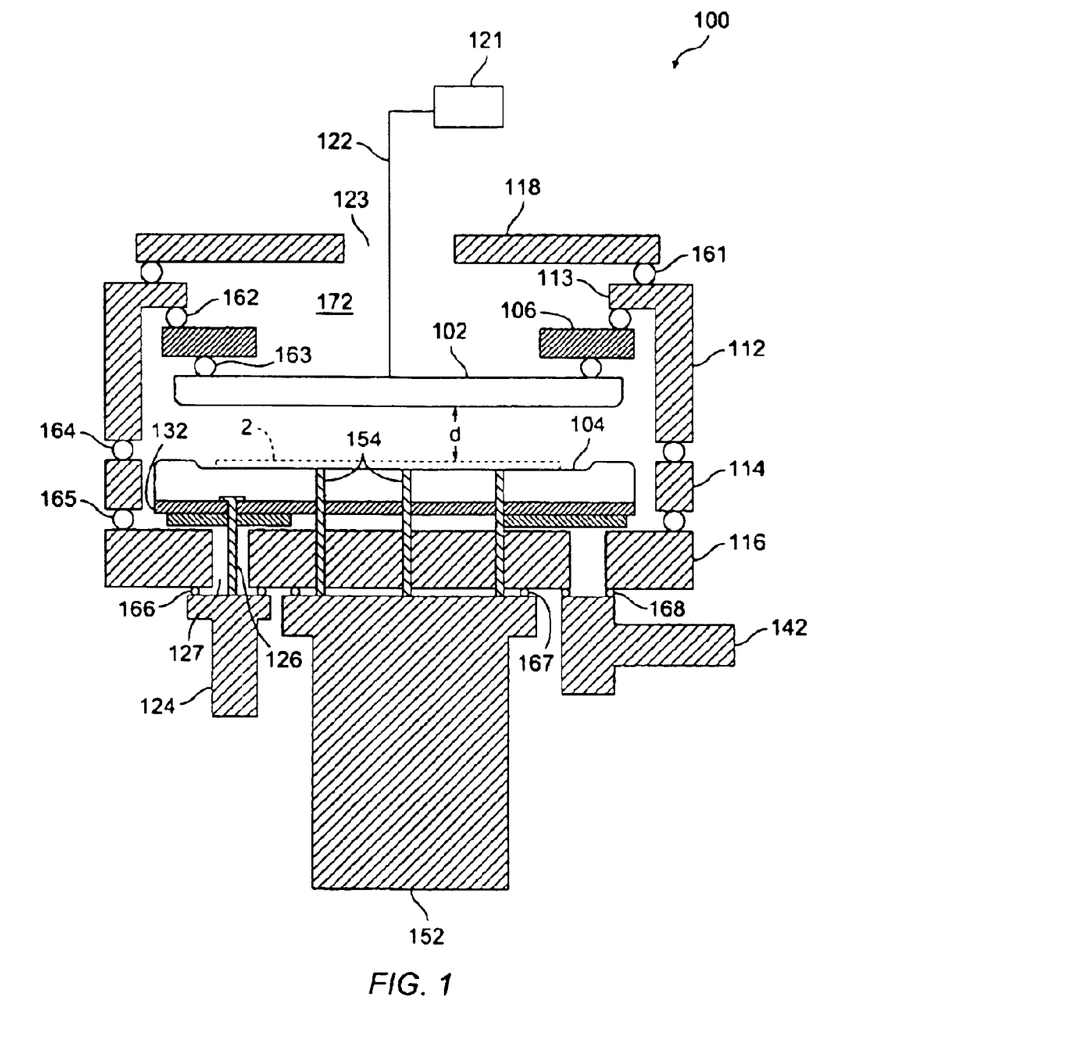
FIGS. 1 and 1A show simplified cross sectional views of a generalized schematic of an apparatus in accordance with the present invention.

FIG. 1 shows a simplified cross-sectional schematic view of a work chamber 100 adapted for plasma activation in accordance with a particular illustrative embodiment of the present invention. The work chamber comprises a lower base portion 116, a lower chamber wall 114, and an upper chamber portion 112. The lower base portion is separably coupled to the lower chamber wall. An O-ring 165 is provided between the lower base portion and lower chamber wall to provide a vacuum seal. Similarly, the lower chamber wall 114 is separably coupled to the upper chamber portion 112, and achieves a vacuum seal with the upper chamber portion by way of an O-ring 164. An upper lid 118 engages an upper surface of the lid 112 via an O-ring 161. The assembly collectively defines an interior chamber 172 within which the wafer bonding activation occurs.

In one variation of the illustrated embodiment, the subassembly comprising the lower base portion 116, the lower chamber wall 114, and the upper chamber portion 112 might be constructed as a single member. However, having separate members facilitates access to the interior chamber 172. Also, having separate members facilitates access to the interior for cleaning purposes and other general maintenance activities. This and other configurations are possible.

Within the interior chamber 172, an electrically conductive lower platen member 104 is disposed upon the lower base portion 116. The lower platen is held in substantially fixed relation to the lower base portion. A quartz diffuser 132 is disposed between the lower platen member and the lower base portion. The quartz diffuser acts as an insulator to provide electrical isolation of the lower platen member from the lower base portion. The quartz diffuser also defines the gas flow such that turbulence is reduced and particle generation is limited.

Figure 1A:
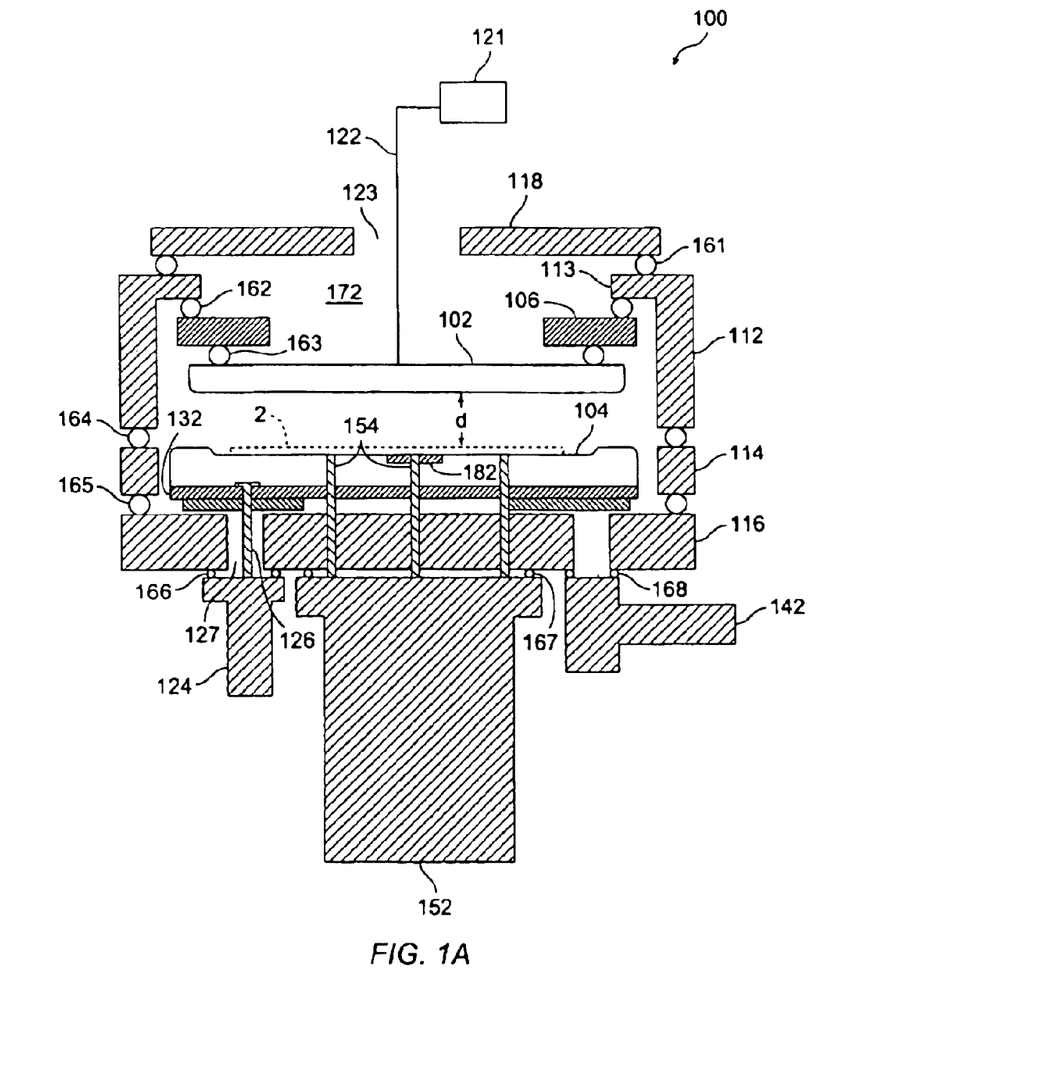

Referring for a moment to FIG. 1A, in another embodiment of the invention, the lower platen member 104 might be configured with one or more magnets 182 disposed in the lower platen. The magnet(s) serves to focus and confine the plasma during a plasma activation operation.

Figure 10:
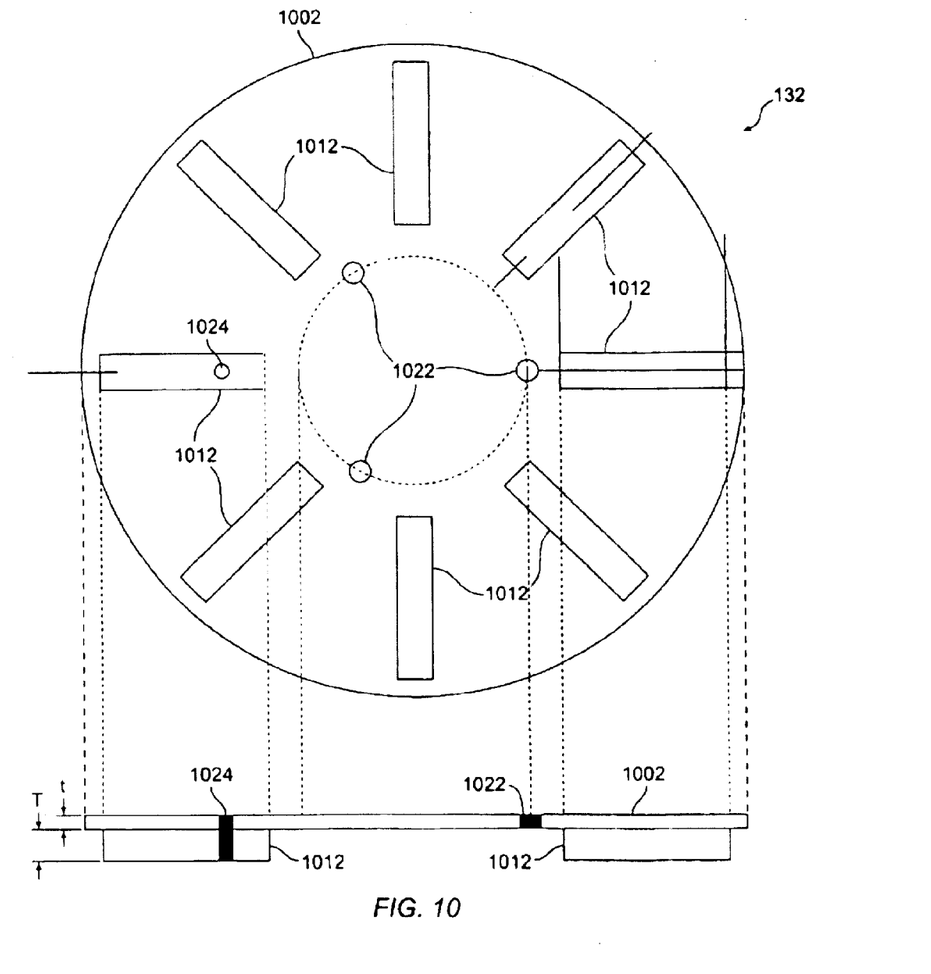
FIG. 10 shows a simplified diagram of the quartz diffuser shown in FIGS. 1 and 1A.

Turning now to FIG. 10 for a moment, an illustrative embodiment of the quartz diffuser 132 is shown. The quartz diffuser comprises a quartz disk 1002 having openings 1022 formed through its thickness t. As will be discussed in further detail below, these openings are aligned with lift pins 154 (FIG. 1) and are provided so that the lift pins can pass through the diffuser. A plurality of quartz fins 1012 are arranged on a bottom surface of the quartz disk 1002. These fins provide a means for reducing turbulence within the chamber during processing. While the disclosed arrangement has been observed to be efficacious, other configurations and arrangements might be possible. An opening 1024 is provided through one of the fins for an RF feedthrough, as will be discussed below. Returning to FIG. 1, an electrically conductive upper platen member 102 is disposed above the lower platen member 104. A substrate 2 (shown in phantom lines) is disposed upon the lower platen. In a particular embodiment of the invention, the upper platen is spaced apart from an upper surface of the substrate by a distance "d." The range of separation is about 1 mm to about 150 mm. As will be discussed below, the desired separation "d" for any given apparatus is a function of the geometry of the interior chamber 172 and of the internal components. The separation might be determined first by making a calculation to arrive at a rough estimate. Then a desired value is obtained empirically, by manual adjustment.

In a particular illustrated embodiment of the present invention, a silicon coating is provided on the interior surfaces of the upper lid 118, the upper chamber portion 112, the lower chamber wall 114, and the lower base portion 116. The lower platen 104 and upper platen 102 are also provided with a silicon coating. Amorphous silicon is used in SOI (silicon on insulator) production because it can only act as a self contaminate. The amorphous nature of the coating allows for less chipping due to lack of grain boundaries and is less prone to RF arcing from the plasma source. In addition, the diffusion coefficient of metallic contaminats into amorphous silicon is extremely limited. Thus the coating is self protecting. The coating functions best when it is conducting or semiconducting. The silicon is a preferred choice to silicon dioxide. For non-SOI based applications other coatings could be applied. For example, anodized aluminum for ceramic packing applications can be used. The silicon coating may be deposited using a CVD type deposition method. The silicon coating provides a conductive surface within the interior chamber 172 to facilitate the conduction of the plasma. The silicon coating also serves to reduce contamination during the plasma treatment of the substrate surface. The use of other coatings or simply leaving the interior surfaces un-coated may result in the production of contaminants, which adversely affect the product functionality.

A quartz insulator ring 106 is disposed between the upper platen member 102 and the upper chamber portion 112. The quartz insulator ring provides electrical insulation between the upper platen member and the upper chamber portion. A pair of O-rings 162 and 163 are disposed respectively between the lower surface of the upper chamber lid and the quartz insulator ring and between the quartz insulator ring and the upper platen member. Both the quartz insulator ring 106 and the quartz diffuser 132 are preferably annealed to substantially reduce stress in the material. All edges including inside edges of openings formed through the quartz components are rounded in order minimize arcing, and fired to ensure clean surfaces that are free of contaminating particles. Edges, corners etc. of coated parts can be rounded and finished to prevent arcing. Interior chamber parts can be rounded and finished to prevent arcing.

A first radio frequency (RF) source 121 is provided to produce a first RF signal. The RF signal is coupled to the upper platen member 102 via a conventional and commercially available RF electrical feed-through 122. The feedthrough comprises a receptacle portion, which is press-fit into an opening in the upper platen member. An opening 123 is provided through the upper lid 118. The RF feedthrough includes a cable portion, which couples to the receptacle, through the opening 123. A second radio frequency source 124 is provided to produce a second RF signal that is coupled to the lower platen member 104 via a second vacuum sealed RF feedthrough 126. An O-ring 166 is provided to ensure a vacuum seal where the second RF feedthrough enters through an opening 127 formed through the lower base portion 116. As noted above an opening 1024 is provided through the quartz diffuser 132, allowing for the second RF feedthrough to couple to the lower platen member 104. In a particular embodiment of the invention, the RF generators were obtained from Advanced Energy Model LF5, capable of producing a tunable 50 KHz –400 KHz signal at 500 W. Preferably, the second source has a lower frequency and lower power. Such lower frequency and lower power biases the plasma ions onto the substrate surface but does not cause damage of the first source, which is often higher power. The plasma ions are deposited onto the surface rather that injected into the surface due to the lower frequency of the second source. This prevents surface damage to the substrate that might result in etching or electrical properties damage to the substrate or device being activated for bonding. By balancing the source and bias frequencies with respect to the cyclotron frequency it is possible to sustain the plasma with the source power supply maximizing the number of ions by limiting recombination. The bias power supply couples the ions onto the surface. The power settings are adjusted to reach ignition for a given operating gas pressure with the source power supply. The bias power supply is adjusted for a given dielectric constant of the substrate so that the ions are attracted to the surface of the wafer.

In a specific embodiment, a vacuum T fitting 142 is provided to access the vacuum system and the gas source(s) A first function of the vacuum T fitting 142 is to evacuate the interior chamber 172 to create a vacuum therein. A second function of the source 142 is to provide the gas, which will serve as the plasma. The vacuum and gas source is coupled to the lower base portion 116 via an O-ring 168. Of course, one of ordinary skill in the art would recognize many variations, modifications, and alternatives.

A lift pin assembly 152 is provided to receive a substrate and lower it onto the lower platen. It is also used to lift a treated wafer (shown at the phantom lines) off the surface of the lower platen 104 upon completion of a plasma treatment in accordance with the invention. The lift pin assembly comprises a plurality of lift pins 154 and includes actuators (not shown 152 is the actuators) for remotely actuating the lift pins, for example by computer control. The lower base portion and the quartz diffuser 132 have correspondingly aligned openings formed there through for each of the lift pins. The lift pin assembly is coupled to the lower base portion 116. An O-ring 167 disposed about the set of lift pins ensures a vacuum-sealed coupling of the lift pin assembly to the lower base portion. Lift pins are lined with quartz sleeves to prevent plasma etching of metal surfaces that might result in chamber and sample contamination. The ends of the lift pins have Teflon bumpers to prevent backside scratching of the substrate surfaces and also facilitate the vacuum seal of the lift pins against the wafer backside to prevent wafer slippage during transport into and out of the process chamber. In preferred embodiments, the platen has a surface with concentric ring structures, where each of the rings is separated by a recessed region or groove. Such groove has a sufficient depth and thickness to prevent a substrate from sticking to the surface of the platen. Of course, the exact size and shape of each groove depend upon the application.

Figure 2:
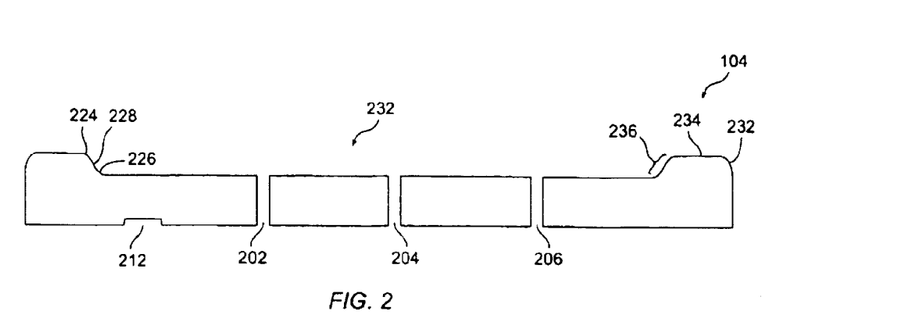
FIG. 2 shows a simplified cross-sectional view an embodiment of the lower platen member shown in FIG. 1.

Refer now to FIG. 2, for a general cross-sectional view of the lower platen member 104. A major area 232 of the upper surface of the lower platen member is recessed. An annular shoulder 234 circumscribes the recessed area 232. The purpose of the recess is to often prevent the wafer from sliding on the platen. It is centered in the chamber. The lower platen member 104 has openings formed therethrough for the lift pins 154 of the lift pin assembly 152, to allow the lift pins to extend above the surface of the recessed area 232 thus lifting a wafer (shown with phantom lines) into a position for removal. Though the figure shows three such openings 202–206, it is understood that the lower platen member will be provided with a sufficient number of openings to accommodate all of the lift pins. The bottom surface of the lower platen member has a blind hole 212, which is provided as a coupling location for an RF feedthrough from the second radio frequency (RF) generator 124.

The outer edge 222 of the annular shoulder 234 is radiused, for example by machining, to have a smooth curve. A transition region 236 between the recessed area 232 and the annular shoulder 234 is similarly machined. In a particular instance, an inner corner 224 of the shoulder is machined to provide a curved profile. The curved profile of the inner corner 224 continues along a gradual bevel 228 to an inside corner 226 having a smoothly curved profile and terminates in the recessed area 232. The purpose of the curved profiles is to prevent arc formation, since arcing tends to produce contamination by sputtering. The holes 202–206 are similarly radiused and smoothed.

Figure 3:
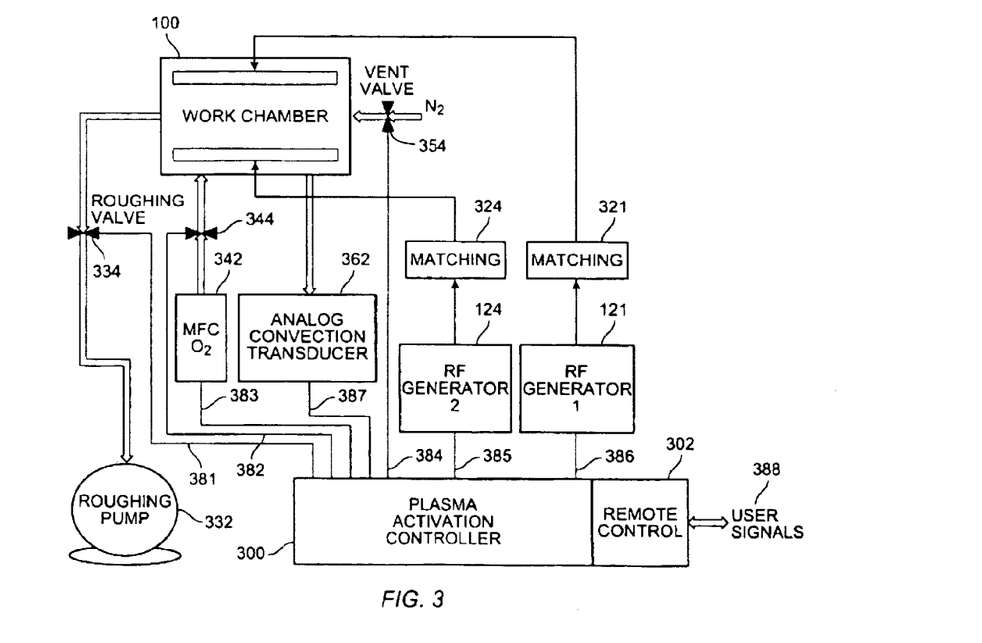
FIG. 3 illustrates in block diagram form a high level organization of a plasma activation system in accordance with the invention.

Refer now to FIG. 3 for a discussion of plasma activation in accordance with the invention. The figure shows the plasma activation chamber 100 in relation to the components, which collectively constitute the plasma activation system. In a particular embodiment of the invention plasma activation is initiated in a computer-controlled manner. This has the advantage of repeatability and flexibility in fine tuning a plasma activation procedure, and facilitates experimental runs. A plasma activation controller 300 might be provided by a general purpose CPU; for example, a PC-based computer running dedicated software. Alternatively, the plasma controller might be implemented in a microcontroller architecture or a combination of timers and relays, which provide logic and control aspects.

The plasma activation controller 300 may include a remote control front end controller or interface 302 which communicates directly with the cluster tool computer. The remote control front end is used to switch the controller from manual control to automated control. This allows the service engineers to gain control over the individual tool functions during service and repair operations. Interaction occurs by exchanging user signals 388 to initiate actions on the system and to receive feedback from the system.

The plasma activation controller 300 issues signals 385, 386 to the RF generators 124, 121, respectively. These control signals turn the power on and off to the platen while the frequencies, power settings, and processing time of the generated RF signals generally present on the generators themselves. In a separate embodiment it is possible to implement full computer over the RF generator functions including selection of frequencies, power settings, and process time. Each RF generator 124, 121 has a corresponding match unit 324, 321, respectively to match the electrical characteristics of the output of the generator to the respective lower and upper platen members 104, 102 to achieve maximum signal transfer. As noted, the supplies are matched and out of phase so that the method can operate efficiently. The frequencies of the two RF generators are not usually integral numbers of each other to prevent signal feedback of one RF source into another, but may be in some embodiments. A roughing pump 332, e.g., a conventional dry mechanical pump, is used during the plasma activation and bonding operation. It is selectively brought into fluidic communication with the work chamber 100 by a roughing valve 334 under the control of a signal 381 produced by the plasma activation controller. The roughing pump evacuates the work chamber, and is used during the backfill phase of the activation process and also during venting operations.

An $O_2$ MFC (mass flow controller) provides the $O_2$ gas to produce the $O_2$ plasma within the work chamber 100. The plasma activation controller 300 issues signals 382 and 383 to control the $O_2$ source and valve in a cooperative manner to feed the gas into the work chamber thereafter it is ignited to produce the $O_2$ plasma. In other embodiments of the invention, it is understood that other gases can be used to produce other plasma species. For example, hydrogen, argon, water, nitrogen, ammonia, and peroxide vapor, are among usable alternate gases.

An analog convection transducer 362 measures the interior pressure within the work chamber 100. It provides pressure measurements to the plasma activation controller 300 during the processing. It serves as an endpoint detection device to send control signals back to the controller unit to indicate change of vacuum status and readiness for process continuation.

A vent valve 354 is provided to permit the introduction of a backfill gas to purge the system at the end of the activation operation. The valve is activated in response to a control signal 384, which issues from the plasma activation controller 300. FIG. 3 shows the use of a venting gas. However, it is understood that in other embodiment of the invention any of a variety of gases can be used. Argon, helium, and oxygen are common examples. As noted, $N_2$ may also be used in some applications. Moreover, the venting gas might be the same species as that used to produce the plasma. In another embodiment, the vent gas could be introduced into the chamber through the same gas fittings as the source gas.

Figure 4:
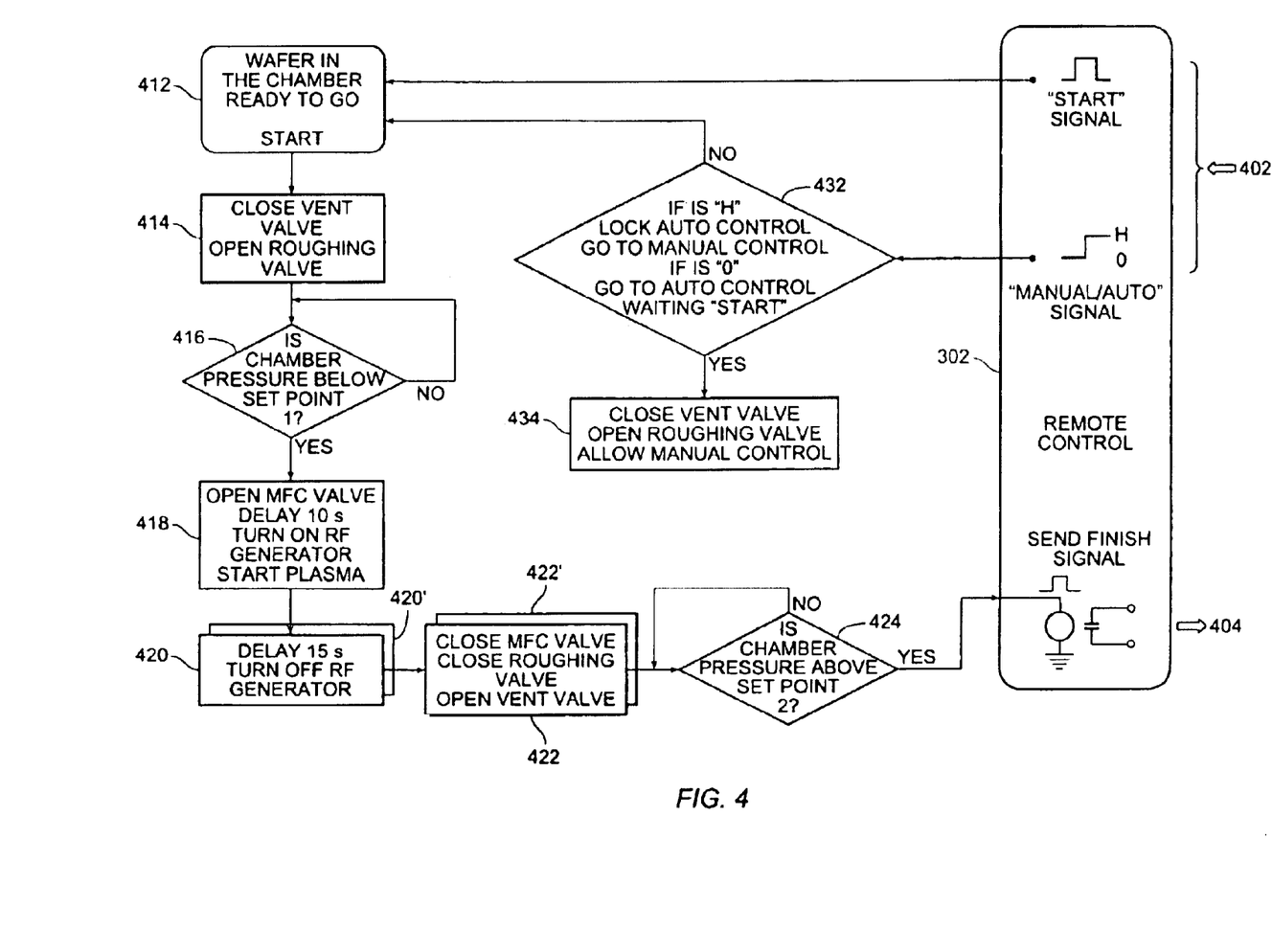
FIG. 4 is a simplified system control flowchart of an illustrated embodiment of the present invention.

Referring now to FIGS. 3 and 4, a high level flow chart illustrating a plasma activation procedure in accordance with an embodiment of the invention is shown. As discussed above, a user may interact with the system via the remote control front end 302 to the plasma activation system.

First, the substrates for bonding are loaded into the work chamber 100, step 412. In one embodiment of the invention, a user manually loads a substrate to be bonded into the work chamber and onto the lower platen member 104. In another embodiment of the invention, the work chamber is configured to accommodate the two substrates to be bonded so that both substrate surfaces are treated at the same time. In yet another embodiment of the invention, the work chamber is incorporated in an automated system. Thus, referring for a moment to FIG. 5 an automated system comprises a materials handling unit 502 operatively coupled with a substrate cassette subsystem 504 containing substrates (e.g., wafers) to be bonded. The robotic and substrate cassettes are cooperatively coupled with the work chamber 100 to deliver and retrieve substrates to and from the work chamber. The robotic and substrate cassettes may be loadlocked to the work chamber to form an airtight closed system. Alternatively, the substrate cassettes may be maintained in a chamber at atmospheric conditions. In other embodiments the two substrates can be pre-positioned (aligned) relative to one another in a fixture or jig and then placed into the plasma chamber for aligned activation and bonding operations. Supported parts can also be loaded and activated in the chamber via patterned support mechanisms.

Returning to FIGS. 3 and 4, after loading the substrates into the work chamber 100, the plasma activation controller 300 activates the vent valve 354 to close the valve, step 414. Also, in step 414, the roughing valve 334 is activated to couple the roughing pump 332 to the work chamber. The interior chamber 172 (FIG. 1) is then evacuated to create a vacuum. The work chamber 100 is monitored in step 416 during the evacuation step until the pressure in the interior chamber 172 reaches a first set point. In a particular embodiment of the invention the set point is optimized for the specific application and substrate combination. Next, in step 418 the plasma activation controller 300 signals the MFC valve 344 to open in order to initiate a flow of $O_2$ gas into the work chamber 100. In a particular embodiment of the invention, a delay of about 10 seconds (or less) or up to and over one minute is made, after which time the plasma activation controller turns on the first RF generator 121. Here, the delay is used to stabilize the gas before ignition. The ramp rate to full power feature of the Advanced Energy RF generators allows the source power supply to reach full power and match conditions before the bias power supply achieves its matching point. Both matches are turned on simultaneously (or offset by a predetermined delta) but the source reaches full power and stabilizes before the bias source. The entire system is stabilized in less than 1 second. The variable ramp to power rate prevents adverse effects from the RF feedback between the two power supplies before equilibrium is established. The resulting source RF signal is applied to the electrically conductive upper platen member 102. In a specific embodiment, the controller sends a signal to turn on the second RF generator 124 at a predetermined time after turning on the first RF generator 121. The resulting bias RF signal is applied to the electrically conductive lower platen member 104. The $O_2$ gas is ignited to produce an $O_2$ plasma within the interior chamber 172. The substrate surface(s) is exposed to the resulting plasma for a few seconds (e.g., 5–30 seconds) to repeated exposures of a predetermined time (e.g., 5–15 seconds), after which time the RF generators are turned off in step 420, thus extinguishing the plasma. Preferably, the bias RF generator 124 is turned off at the same time as the source RF generator 121. Doing so avoids the possibility of "fluttering" the residual plasma due to signal from the bias RF generator.

It was discovered that bond strengths greater than those provided by conventional techniques could be achieved by a plasma activation treatment of a substrate surface where the substrate potential is time varying. Also, the etching effects of a plasma on a substrate surface can be avoided by the use of low RF frequencies and control of RF power.

Further in accordance with the invention, the frequencies of the signals produced by the RF generators 121, 124 preferably are non-integral multiples of each other. This ensures that there is no interaction between the source RF signal and the bias RF signal, such as resonance.

Still further in accordance with the invention, the separation of the upper platen member 102 from the surface of the substrate to be treated by plasma activation is another consideration. If the upper platen is too close to the substrate surface being activated, the plasma reaching the surface will have a high energy and thus will cause etching of the surface. On the other hand, if the upper platen member is too far from the substrate surface, the plasma will have insufficient energy to be effective in activating the surface. It is also true that for large platen separation distances the ratio of neutrals, to charged species is not optimized. In order to achieve saturation of the surface with radicals it is necessary to optimize this spacing. A rough estimate of the separation can be predicted by the debye length of the ions but final configurations are empirically determined through process optimization. A typical range for a 200 mm wafer tool is ¼" to 1". However, a chamber which is a few inches greater in diameter is provided for platen separation distances of 1.5".

A substrate surface whose surface has been treated by plasma activation according to the present invention bonds exceptionally well to the surface of a second substrate. Treating both surfaces to be bonded results in an exceptionally strong bond. Moreover, the treated surface(s) is substantially free of the etching effects associated with conventional plasma etching systems.

It is noted that the source RF signal is a low frequency signal. This produces a plasma having low energy charged radicals (particles). By providing an additional lower frequency RF bias on the substrate, the charged radicals created by the source RF signal are drawn to the substrate surface without etching the surface. Thus, the surface is "activated" by the presence of these charged radicals.

As a result, a plasma exposure of a substrate surface made in accordance with the invention leaves charged radicals on the surface. These charged radicals have a very high free energy. Consequently, the radicals are very willing to bond with other elements in the substrate to lower its free energy state. Thus, when two such treated surfaces are brought together, a chemical bonding occurs resulting in a large free energy drop and development of a strong bond. A similar result is observed even if only one of the substrate surfaces is treated. The high free energy is also the source of the accelerated kinetic behavior of the bond strength development during post activation thermal treatments. The free energy provides the driving force for the transition from van der Waals bonding to covalent or ionic bonds.

The bonding apparatus and technique of the present invention is especially well suited for semiconductor processing, and related applications in the semiconductor electronics industry. Other uses for substrate bonding include MEMS fabrication and packaging, polymer treated substrates or polymer substrates, ceramic packaging, laminated electronics, dual gate and flip chip bonding and the like.

In a particular embodiment of the invention, at least two substrates are placed in the work chamber 100 and simultaneously treated with the plasma. Then, the two substrates are manipulated so that the two treated surfaces are brought into contact to form an intimate contact between the two treated surfaces. This process can occur after the plasma has been extinguished or with the plasma still alight. During the activation multiple plasma can be used. It is sometimes advantageous to use a reducing atmosphere plasma to "clean" the surface or surfaces and then ignite a second plasma gas to activate the newly cleaned surfaces.

In another particular embodiment of the invention, a first substrate and a second substrate are simultaneously exposed to a plasma in the work chamber 100, thereby effecting a plasma treatment of their respective surfaces. With the plasma still turned on, the plasma treated surface of the first substrate and the plasma treated surface of the second substrate are brought into contact. Subsequent to the bonding of the two substrates and after the plasma has been extinguished, the plasma activation controller 300 signals the MFC valve 344 to block the fluid path between the work chamber 100 and the $O_2$ source 342, step 422, thus shutting off the $O_2$ source to the work chamber. In addition, the vent valve 354 is activated to allow a flow of $N_2$ gas to enter the work chamber to purge the system with a backfill of $N_2$. Alternatively, other gases such as $O_2$ and the like can be used as the backfill.

In yet another particular embodiment, a first substrate is placed in the work chamber 100 and then plasma treated. The first substrate is then placed in a holding area. The holding area is preferably contains substantially no free particles to compromise the activated surface of the first substrate. A second substrate is then placed in the work chamber and then plasma treated. The two substrates are then manipulated such that the treated surface of the first substrate and the treated surface of the second substrate are contacted to produce a bonded substrate pair.

In situ (both parts inside the plasma chamber) bonding can be performed under vacuum or the work chamber can be backfilled with a gas to be trapped at the bond interface. This method is particularly applicable to MEMS device fabrication when gas filled cavities must be hermetically sealed at a regulated pressure (accelerometers e.g.) Thus in an alternative embodiment of the invention, the two treated surfaces can be joined during an additional inert gas purge to a desired pressure set point. In some cases the inert gas may be the same as the source gas. For example, pressure sensors are often bonded under the presence of an inert gas so that the sensing cavity and membrane are calibrated for a specific thermal expansion coefficient for a given inert gas ambient in the sealed cavity. Similarly, chemical sensors are often packaged (bonded) with a reactive gas trapped inside. Other materials such as medicine, liquids, ink, and the like fluids can also be sealed during the bonding process. That is not the function of step 422. In step 424, the work chamber 100 is monitored during the backfill step to detect when the pressure of the interior chamber has reached a second set point. When the second set point pressure has been reached, a signal is issued to alert the user that the bonding operation has completed.

In general, the bonding of two surface treated substrates might be made any time after the surfaces have been exposed to the plasma for a sufficient period of time, and before the backfill operation has completed. Once the substrate surfaces have been joined, a mechanical level might be drawn across the backside of one of the joined substrates to apply pressure to enhance the bonding action, or to initiate the bonding action if bonding had not spontaneously initiated.

FIG. 4 also shows a manual mode of operation. In step 432, a test is made to determine whether a user initiated signal 402 has specified a manual start of the process. If so, then plasma activation controller 300 issues signals to close the vent valve 354 and open the roughing valve 334, to begin evacuating the work chamber 100, step 434. The plasma activation controller then releases control to the user. The activation signals 381–387 are produced in response to receiving user control signals 388.

The following summarizes the foregoing illustrative processing recipes to effect a bonding of substrates in accordance with the present invention:

Method 1
1. Supply work chamber 100 with a substrate for bonding.
2. Evacuate the interior chamber 172.
3a. Infuse a gas and at a time $t_1$ emit a first radio signal (source RF) to ignite the plasma.
3b. Emit a second radio frequency signal (bias RF) with a slower (or same or faster) ramp to full poser tan the first signal.
4. Allow the plasma to treat a surface of the substrate for a specified period of time.
5. Turn off the plasma.
6. Purge and backfill using the same or a different gas as the plasma species.
7. Remove wafer to joining station and perform contact operation in separate chamber. This may or may not involve pattern alignment between substrates.

Method 2
1. Supply work chamber 100 with substrates for bonding.
2. Evacuate the interior chamber 172.
3a. Infuse a gas and at a time $t_1$ emit a first radio signal (source RF) to ignite the plasma.
3b. Emit a second radio frequency signal (bias RF) with a slower (or same or faster) ramp to full power than the first signal.
4. Allow the plasma to treat the surfaces for a period of time.
5. Bring the surfaces into contact with each other, while the plasma is turned on.
6. Turn off the plasma.
6a. (optional) Apply a bonding bar to enhance bonding of the treated surfaces.
7. Purge and backfill using the same or a different gas as the plasma species.

Method 3
1. Supply work chamber 100 with substrates for bonding.
2. Evacuate the interior chamber 172.
3a. Infuse a gas and at a time $t_1$ emit a first radio signal (source RF) to ignite the plasma
4. Allow the plasma to treat the surfaces for a period of time.
5. Turn off the plasma.
6. Purge and backfill using the same or a different gas as the plasma species.
7. Allow the treated surfaces to contact each other, during the purge and backfill.
7a. (optional) Apply a bonding bar to enhance bonding of the treated surfaces.

Referring back to FIG. 5, another embodiment of the invention is shown. Rather than producing bonded substrates, the automated system shown in the figure might be used to produce standalone surface treated substrates 534. The surfaces of the standalone substrates are highly reactive and are readily willing to bond to most chemical species. The standalone substrates are therefore well suited for collecting specimens in a geological expedition, a biological survey, or even in an extraterrestrial environment, such as a lunar expedition or planetary expedition.

Figure 5:
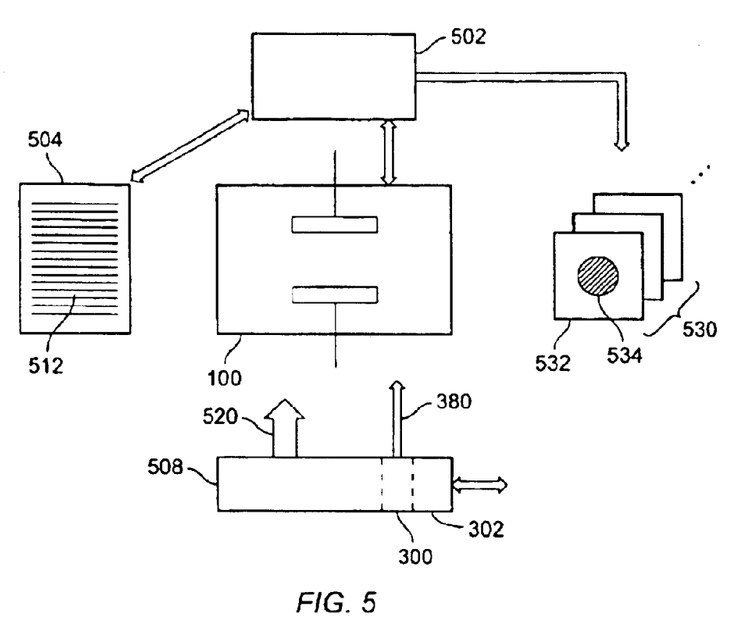
FIG. 5 is a general schematic diagram of an automated bonding system incorporating an embodiment of the present invention.
Figure 6:
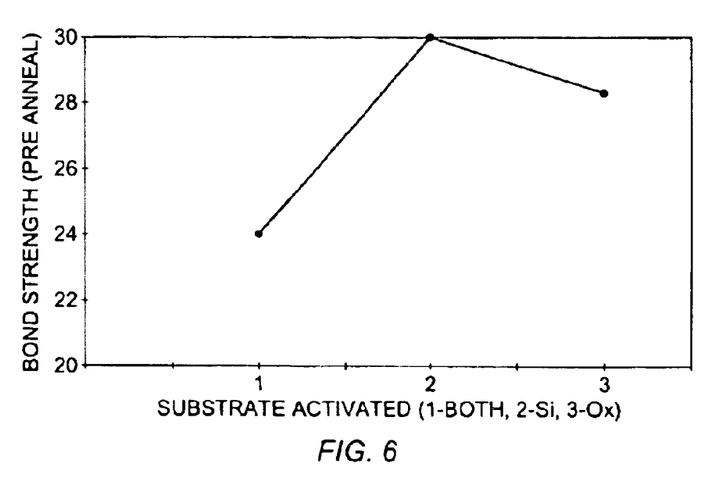
FIGS. 6–9 show the results of various experimental runs relating to the strength of the bonds produced in accordance with the invention.
Figure 7:
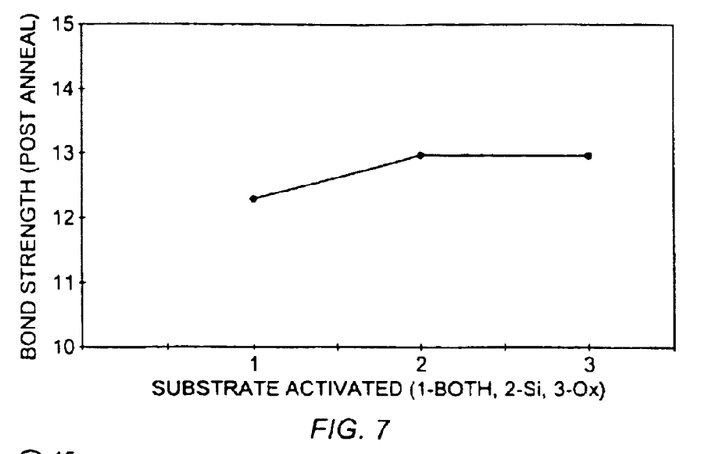
Figure 8:
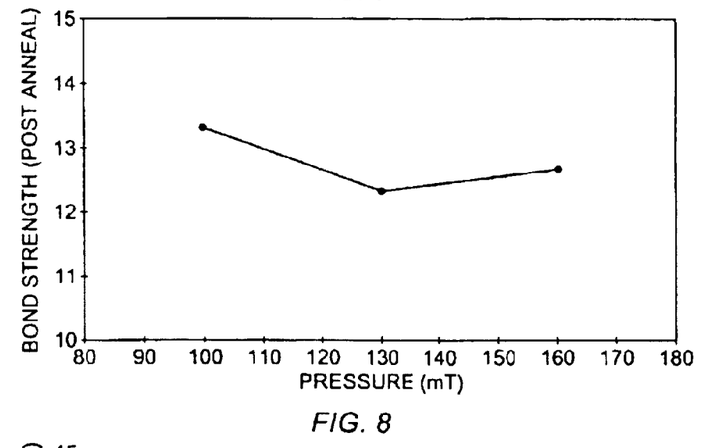
Figure 9:
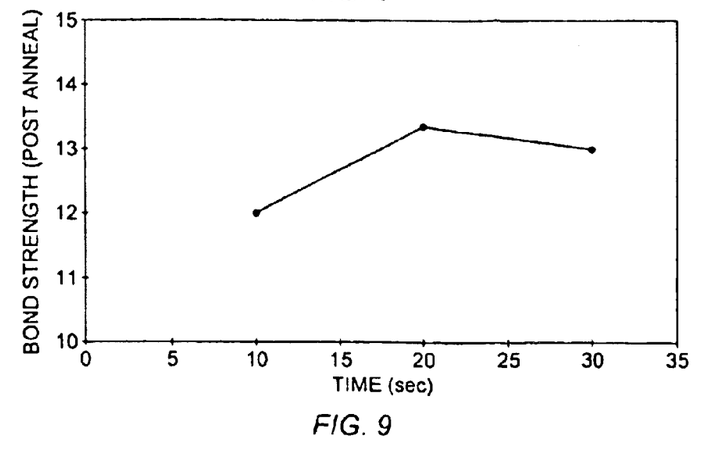

The packaging 532 for the standalone substrates 534 is preferably at least an airtight containment package in order to preserve the highly activated surface of the standalone substrate until is ready for use in the field.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for bonding substrates comprising:
providing a first substrate having a first surface to be bonded;
supplying a first gas;
igniting said first gas to produce a plasma by a first frequency signal and applying said first signal to a first electrode that applies the first frequency signal to the first gas;
producing a second frequency signal;
applying said second frequency signal to said first substrate, said first surface of said first substrate being exposed to said plasma without etching said first surface; and
contacting said first surface of said first substrate to a first surface of a second substrate to produce a bond therebetween.

2. The method of claim 1 wherein said second frequency signal is a second RF signal that is applied to said substrate subsequent to said first frequency signal reaching full power to said first electrode.

3. The method of claim 1 further including spacing said first electrode from said first surface of said first substrate by an amount sufficient to substantially avoid etching said first surface with said plasma.

4. The method of claim 1 wherein said first electrode is spaced apart from said first surface of said first substrate by a distance substantially in the range of one mm to 150 mm.

5. The method of claim 1 wherein said first frequency signal is of a higher frequency than said second frequency signal.

6. The method of claim 1 further comprising applying said second frequency signal to said second substrate, said first surface of said second substrate being exposed to said plasma without etching said first surface of said second substrate.

7. The method of claim 1 wherein said first frequency signal is of a frequency that produces a plasma which does not etch said first surface.

8. The method of claim 1 wherein a frequency of said first frequency signal is not an integral multiple of a frequency of said second frequency signal.

9. The method of claim 1 further including applying a pressure upon a second surface of said first substrate to at least enhance a bonding action between said first surface of said first substrate and said first surface of said second substrate.

10. The method of claim 1 wherein first gas is selected from the group consisting of hydrogen, argon, water vapor, nitrogen, oxygen, ammonia, helium, silane and peroxide vapor.

11. The method of claim 1 further including extinguishing said plasma, wherein said contacting is performed subsequent to said extinguishing said plasma.

12. The method of claim 1 further including extinguishing said plasma, wherein said contacting is performed prior to said extinguishing said plasma.

13. The method of claim 1 further including extinguishing said plasma and then performing a purge by introducing a second gas.

14. The method of claim 13 wherein said second gas is the same as said first gas.

15. The method of claim 13 wherein said contacting is performed during said step of performing a purge.

16. The method of claim 1 wherein interior surfaces of said vacuum chamber have a silicon coating.

17. The method of claim 1 wherein said second frequency signal is applied to a second electrode, said first substrate being in electrical contact with said second electrode.

18. The method of claim 1 further including exposing said first surface of said second substrate to said plasma prior to said contacting.

19. The method of claim 1 further including exposing said first surface of said first substrate and said first surface of said second substrate to said plasma at the same time.

20. A method for bonding substrates comprising:
providing a plasma including supplying a first gas and applying a first radio frequency (RF) signal to a first electrode, wherein said gas is ignited to form said plasma;

applying a second RF signal to a second electrode, said second RF signal having a frequency less than a frequency of said first RF signal;

disposing a first substrate in electrical contact with said second substrate, a first surface of said first substrate being exposed to said plasma;

spacing said first electrode from said first surface such that there is substantially no etching of said first substrate by said plasma; and contacting said first surface of said first substrate to a first surface of a second substrate.

21. The method of claim 20 wherein said second RF signal is applied to said substrate subsequent to applying said first RF signal to said first electrode.

22. The method of claim 20 wherein said first electrode is spaced apart from said first surface of said first substrate by a distance substantially in the range of one quarter of an inch to two inches.

23. The method of claim 20 wherein said first RF signal is of a higher frequency than said second RF signal.

24. The method of claim 20 wherein said first RF signal is of a frequency that produces a plasma which does not etch said first surface.

25. The method of claim 20 wherein a frequency of said first RF signal is not an integral multiple of a frequency of said second RF signal.

26. The method of claim 20 further including applying a pressure upon a second surface of said first substrate to at least enhance a bonding action between said first surface of said first substrate and said first surface of said second substrate.

27. The method of claim 20 wherein first gas is selected from the group consisting of hydrogen, argon, water vapor, nitrogen, oxygen, ammonia, and peroxide vapor.

28. The method of claim 20 further including extinguishing said plasma, wherein said contacting is performed subsequent to said extinguishing said plasma.

29. The method of claim 20 further including extinguishing said plasma, wherein said contacting is performed prior to said extinguishing said plasma.

30. The method of claim 20 wherein interior surfaces of said vacuum chamber have a silicon coating.

* * * * *